United States Patent [19]

Jennings

[11] Patent Number: 5,094,160

[45] Date of Patent: Mar. 10, 1992

[54] ACCURATE REGISTRATION OF PRINTING SCREENS TO A PLATEN

[75] Inventor: Roger Jennings, Glens Falls, N.Y.

[73] Assignee: R. Jennings Manufacturing Co., Inc., Glens Falls, N.Y.

[21] Appl. No.: 149,668

[22] Filed: Jan. 28, 1988

Related U.S. Application Data

[62] Division of Ser. No. 901,400, Aug. 28, 1986, Pat. No. 4,738,909.

[51] Int. Cl.⁵ .............................................. B41F 15/36
[52] U.S. Cl. .................................................. 101/127.1
[58] Field of Search ................ 101/114, 129, 127.1, 101/128, 128.1, 401.1, DIG. 36, 415.1, 485, 486; 430/22, 308

[56] References Cited

U.S. PATENT DOCUMENTS

| | | | |
|---|---|---|---|
| 2,680,405 | 6/1954 | Faeber et al. | 101/401.2 |
| 3,356,023 | 12/1967 | Schuttenberg | 101/128.3 |
| 3,483,820 | 12/1969 | Schuttenberg | 101/127.1 |
| 3,605,614 | 9/1971 | Gilman et al. | 101/126 |
| 3,943,851 | 3/1976 | Inada et al. | 101/127.1 |
| 4,223,055 | 9/1980 | Castilluzzo et al. | 428/40 |
| 4,738,909 | 4/1988 | Jennings | 430/22 |

FOREIGN PATENT DOCUMENTS

| | | | |
|---|---|---|---|
| 2724319 | 8/1978 | Fed. Rep. of Germany | 101/127.1 |
| 197808 | 8/1978 | German Democratic Rep. | 430/22 |
| 115849 | 1/1984 | Japan . | |
| 1564498 | 4/1980 | United Kingdom . | |
| 2067468 | 7/1981 | United Kingdom . | |

OTHER PUBLICATIONS

Preregistration, Susan Venell, Screen Printing, pp. 92-95, Jul., 1983.

Primary Examiner—J. Reed Fisher
Attorney, Agent, or Firm—Nixon & Vanderhye

[57] ABSTRACT

Printing screens for the screen printing of garments (e.g. T-shirts and caps) are accurately registered with respect to a printing platen of a printing machine for four color printing, or the like. The equipment utilized for the accurate registration is exeptionally versatile and easy to use, requiring no skilled labor to properly implement it. A kit includes a registration plate having pins upstanding from its, the pins having a predetermined size and spacing; four clamps for engaging a screen frame and each with an extension having openings of the same size and spacing as the pins of the registration plate; and a collar for removable attachment to the printing machine and including upstanding pins of the same size and spacing as the registration plate pins. The collar can be for attachment to a T-shirt platen, cap platen, or printing machine arm. In use four positives are stacked and punched so that they have openings of the same size and spacing as those on the clamp. Each positive is mounted to a screen using the registration plate and clamp, and exposed. Then a screen is loosely mounted to the printing machine and moved so that the extension openings are in alignment with the collar pins, and then the screen is tightened into place on the machine. This is repeated for all screens, and after mounting of the screens on the machine the position of the clamps with respect to the screens are marked, and the clamps are removed before printing.

7 Claims, 5 Drawing Sheets

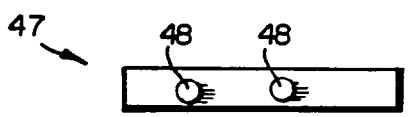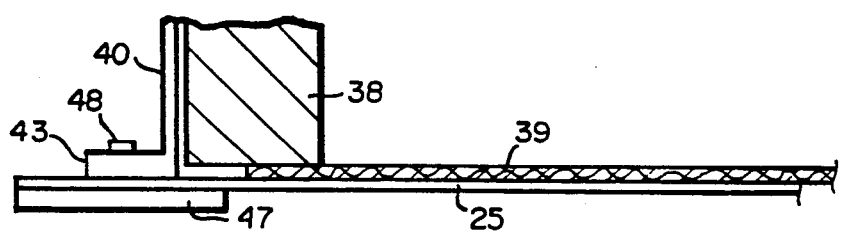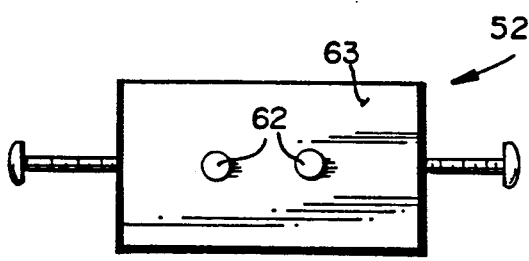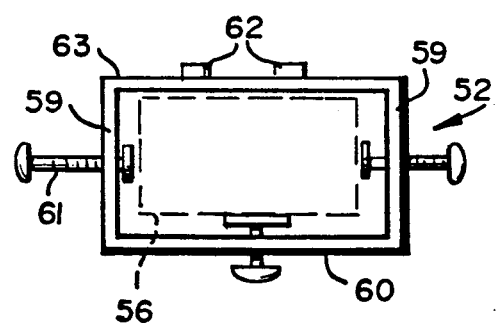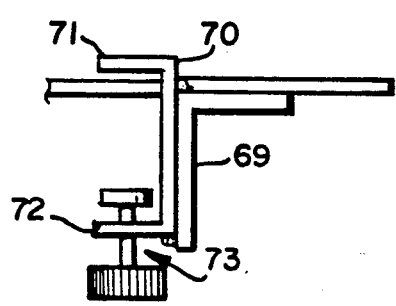

ACCURATE REGISTRATION OF PRINTING SCREENS TO A PLATEN

This is a division of application Ser. No. 901,400, filed Aug. 28, 1986, now U.S. Pat. No. 4,738,909.

BACKGROUND AND SUMMARY OF THE INVENTION

In the screen printing of garments, in order to obtain high quality products it is necessary that the screen be properly aligned with the platen. This is especially important in multi-color printing in which it is necessary that each screen, for each different color, have the indicia (to be printed on the garment) thereon properly positioned with respect to each of the other screens and platen so that as each screen is moved into association with the platen the indicia from the screen is properly aligned to print a clear, high quality image on the garments.

In order for registration to be effected successfully, it is necessary to register the multi-color positives with respect to each other, and there must be an accurate relationship between where the image transferred from the positive to the screen falls with respect to the platen.

The most common method in use for registering screens to the printing machines is to tape each positive onto the platen, and then align the screen to the positive. When the screen is in position over the positive the screen is fastened into position using the conventional knobs provided on the screen printing machine. In order to be successful, the person practicing the method must exercise extreme care, have patience, and take his or her time. Good light is also necessary. One of the many problems encountered in practicing the method is that when the knobs are tightened the torsional force of the knobs turning creates a creep in the screen frame causing it to move out of registration.

Another commonly utilized method is often referred to as micro-registration. There are a number of commercially available products for effecting micro-registration, allowing minor adjustment to align the screen with the positive. Using these devices, too, however, the operator needs a good eye and must have the time and patience to do a good job.

Another commercially available machine uses a plug-in registration system. In this system, the screen arms on the machine must all come down exactly to the same position. If for any reason any one of the arms do not come down in the same position, such as due to wear, the machine will be out of registration. The film positives are placed in registration with the machine by aligning the positives in a dark room with dowels or with a grid, with each positive aligned to its respective frame in exactly the same way in the dark room. Wooden frames cannot be utilized, but rather only aluminum frames have the necessary dimensional stability. The assumption is made in this system that because the positives are all exposed in exactly the same way in registration to the screen frames that the same registration will result on the screen printing machine; however if due to wear, or other real-life factors, this assumption is incorrect, accurate registration does not ensue.

Most machines that are on the market that attempt to facilitate accurate registration are specific to one or a few pieces of equipment, and therefore cannot be employed by a high percentage of potential users.

According to the present invention, a simple method and apparatus are provided which ensure accurate registration of screens with the platen in multi-color printing. In addition to being simple yet effective, the equipment is very versatile, not being specific to the particular manufacturer of printing machinery, or the particular type of frame utilized.

According to one aspect of the present invention, a kit is provided for facilitating the accurate registration of each of a plurality of printing screens in association with a printing platen. The kit includes a registration plate having a plurality of pins upstanding from it, the pins having a predetermined size and predetermined spacing from each other; a plurality of clamps; and one or more collars. One clamp is provided for each different color to be printed (e.g. four clamps for a four color system). Each clamp has a clamping portion dimensioned to engage the frame (whether wooden or aluminum) of a screen. The clamp has an extension with a plurality of openings in it, the openings having the same size and spacing as the pins of the registration plate. The collar is attachable to the printing machine and has a plurality of upstanding pins, with the pins having the same size and spacing as the pins of the registration plate. The collar may be particularly adapted to attach to a T-shirt platen, or to a cap printer, or to the arm of the printing machine. The clamp may be designed to accommodate a cap printer with a bill support.

The invention also encompasses a method of accurately registering printing screens with a platen during multi-screen (typically multi-color) printing of a garment. The method steps are as follows: (a) Aligning a plurality of film positives having indicia thereon so that the indicia on each positive is properly aligned with the indicia on all the other positives. (b) Providing a plurality of openings in each of the positives so that the openings of all the plurality of positives are aligned with each other when the positives are aligned, the openings in each positive being of the same predetermined size, and spaced a predetermined distance from each other. (c) Mounting a clamp, having a plurality of openings of the same size and spacing distance as the openings in the positives, onto the frame of each of the plurality of printing screens. (d) For each positive, assembling the positive and a screen together with the positive overlying the screen fabric and with pins, having the same size and spacing as the openings in the positive and clamp associated with the screen, passing through the openings in the positive and clamp to hold the positive and screen together in precise alignment. (e) Exposing each positive-screen assembly to transfer the indicia on the positive to the screen fabric. (f) Removing each positive from assembly with its associated screen. (g) Mounting a collar having a plurality of pins of the same size and spacing as the openings in the screen clamps, in alignment with the platen of the printing-machine. (h) For each of the plurality of screens, aligning the screen in printing position with the platen by loosely mounting the screen to the printing machine, moving the screen so that the clamp overlies the collar, adjusting the position of the screen in the printing machine so that the openings in the clamp are aligned with the pins of the collar, and affixing the screen in that aligned position on the printing machine. (i) Removing the clamp from each of the screens after the practice of step (h), and before printing of garments with the screens. And, (j) marking the position of the clamp on the screen prior to the practice of step (i) so that after printing with the screen, and removal of the screen from the printing machine, the clamp may be accurately located on the screen, and thus the screen on the printing machine, if it is desired to use the screen on the machine again.

Step (b) can be practiced in a number of different ways. One way is to punch the film positives while they are properly aligned, and in a stack. Another way to practice step (b) is by overlapping each film positive with a non-film positive piece of material; making a wallpaper cut at the overlapped portions of the positive and material to provide them with adjacent edges; taping the material and positive together so that the edges abut each other; and providing the openings in the material.

The invention also encompasses component parts of the equipment described above, as well as sub-steps of the method described above.

It is the primary object of the present invention to provide a method and apparatus for accurately registering screens to a platen for the screen printing of garments and the like. This and other objects of the invention will become clear from an inspection of the detailed description of the invention and from the appended claims.

BRIEF DESCRIPTION OF THE DRAWINGS

FIGS. 6 and 7 are top plan and side views, respectively, of an exemplary registration plate according to the invention;

FIG. 8 is a view, like that of FIG. 4, showing the registration plate and a film positive in operative association with the other components;

FIGS. 9 and 10 are top plan and side views, respectively, of one form of collar according to the invention, for use directly on the arm of a screen printing machine;

FIG. 13 is an end view of one side of the collar of FIG. 12 looking in the direction of arrow A;

DETAILED DESCRIPTION

Figure 1:
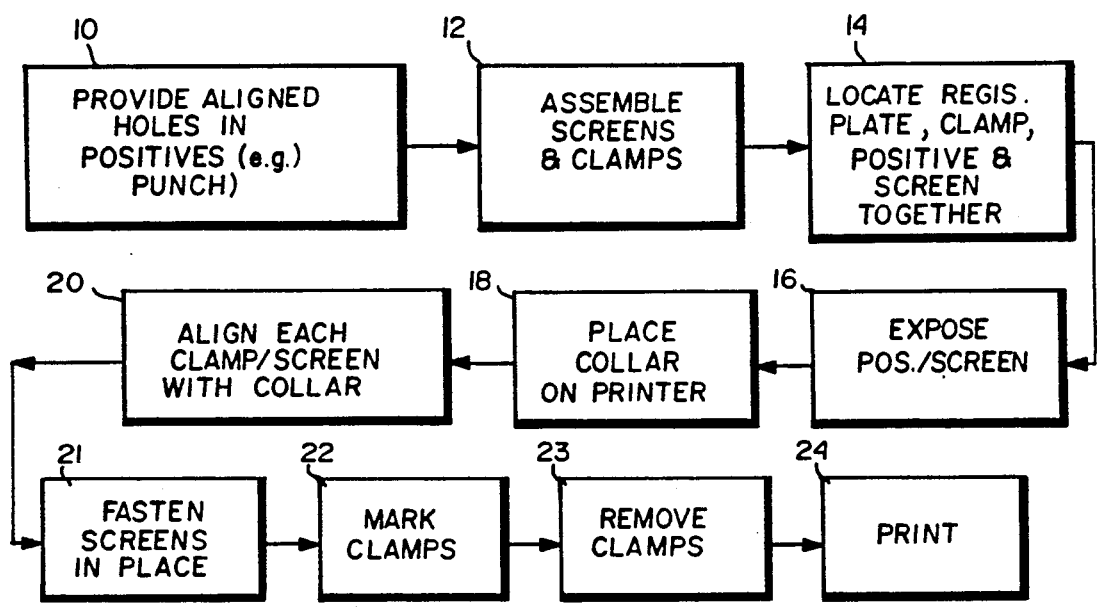
FIG. 1 is a schematic illustration showing the method steps that may be practiced in furtherance of the invention.

The most significant steps in the practice of an exemplary method according to the present invention for accurately registering printing screens with a platen of a printing machine, are illustrated schematically in FIG. 1. As indicated at 10, first aligned holes are provided in a plurality of film positives, having indicia thereon. At 12, the screens and clamps are assembled together, and then at 14 the registration plate, clamp, positive, and screen are located together with the openings in the positives aligned with identical openings in the clamps, and the pins from the registration plate passing through the aligned openings. Then at 16, using a conventional exposing unit, the positive/screen assembly is exposed to light to cure the photosensitive emulsion in the screen fabric except where the image from the positive appears. After exposure, the screens are washed out, and then are aligned on the printing machine. At 18 an appropriate collar is placed on the printing machine, the collar having upstanding pins for aligning with the clamp openings. At 20 each clamp/screen assembly is aligned with the collar, and the screens are fastened in place in the machine at 21. Then the position of the clamps on the screens are marked at 22, the clamps are removed at 23, and the user is ready to print at 24.

The method and apparatus according to the invention utilize the same size and spacing between the holes and pins at each step of the registering process. This provides the necessary accuracy of the registration. The design of the equipment and the particulars of the method steps, that are utilized in the practice of the invention make the apparatus and method simple and versatile.

The first step in the practice of the method of the invention is to properly align all of the film positives so that the registration marks, and indicia, on each match. This may be done, as is conventional, by stacking the film positives 25 (see FIG. 2) so that they have overlapping edges on one end, with cut, aligned edges 27 on the other end and are held together by a piece of tape 28 or the like.

Figure 2:
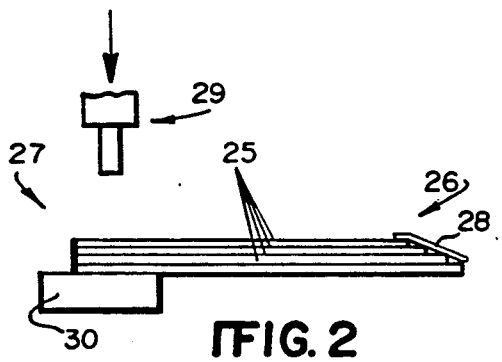
FIG. 2 is a side schematic view illustrating one manner in which aligned holes may be provided in the positives.

The next step is to provide aligned openings in the positives 25; that is when the openings in the positives are aligned, the indicia on the positives also will be aligned. One way that this can be accomplished is illustrated schematically in FIG. 2 wherein a conventional punch 29 cooperating with a die 30 punches holes in the positives 25 when they are stacked as indicated in FIG. 2. A conventional litho punch is desirable for this purpose, the simultaneous punching of aligned positives being known per se in the art.

Since film positive material is relatively very expensive, however, and particularly in situations where large areas are to be printed, instead of simultaneous punching of the film positives (with the area surrounding the punched openings obviously being wasted), another technique according to the invention may be employed. Utilizing this technique, positives 25 are aligned as before (see FIG. 3), and they have the edges 27 thereof overlapped with pieces of plain plastic 31, or like non-film positive material. The material 31 is very inexpensive compared to the film positives 25. Once the edges have been overlapped, as indicated by the edges 32 and 27 in FIG. 3, a wallpaper cut is made; that is a razor blade, or other sharp instrument, is used to cut a clean, precise cut along the line 33 to provide adjacent edges of the material 31 and film positive 25 to abut against each other.

Figure 3:
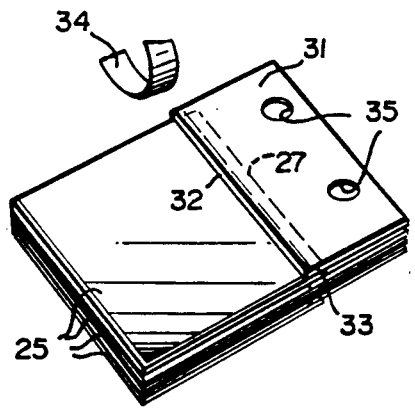
FIG. 3 is a schematic perspective view illustrating another manner in which holes may be provided in the positives.

After the scrap is removed, the edges of each piece of material 31 and each associated positive 25 are moved into abutting engagement and a piece of tape, or the like, as indicated at 34 in FIG. 3, is utilized to hold them together. Then, with the positives 25 reassembled in a stack, the holes 35 may be punched therein. Alternatively, the holes 35 may be prepunched in the material 31.

The openings 35 are preferably circular, and have a predetermined size (e.g. diameter) and are spaced a predetermined distance from each other. While two holes are suitable for most situations, where necessary three or more holes may be utilized.

Figure 4:
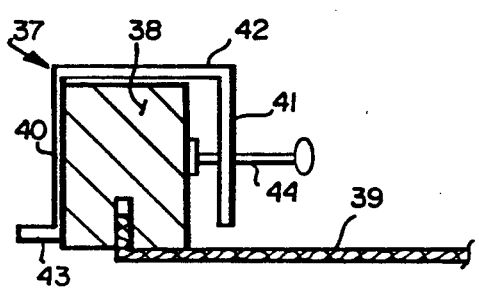
FIG. 4 is a side view, partly in cross-section and partly in elevation, illustrating the interconnection between a clamp and screen facilitating printing, according to the invention.
Figure 5:
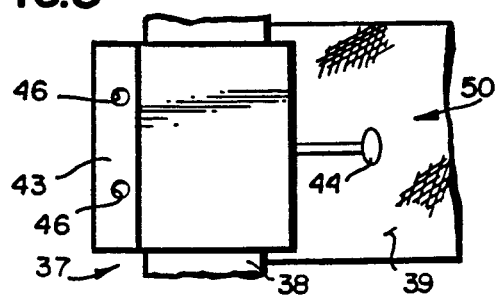
FIG. 5 is a top detail view of the structure of FIG. 4.

The second aspect of the method according to the invention is to utilize an alignment-assisting device in association with the printing screen, on which the image to be printed will be transferred from the positive. A simple and effective device for performing this according to the invention comprises the clamp 37, one form of which is illustrated in FIGS. 4 and 5. FIG. 4 illustrates a conventional screen having a wooden frame formed by four side members, one such member 38 being seen in FIGS. 4 and 5. A conventional screen fabric 39 is held taut by the screen frame components 38.

The clamp illustrated in FIGS. 4 and 5 includes a first side 40, a second side 41 substantially parallel to the first side 40, and a bottom 42 extending substantially perpendicularly to the sides 40, 41 and connecting them at one end thereof. At the other end of the side portions 40, 41 they are open, with an extension 43 extending generally perpendicularly to the first side 40 at the opposite end thereof from the bottom 42. A conventional clamping screw 44 extends through the second side 41 in screw-threaded engagement with an opening therein. The screw 44 is tightened down to hold the clamp 37 in immovable relationship with the frame component 38. While it is not essential that the clamp 37 be at the center point of the frame component 38, it is desirable that it be approximately at the center point.

The extension 43, as seen in FIG. 5, has a plurality of openings 46 therein. These openings are of the same size as the openings 35 in the film positives, and are spaced from each other the same distance.

A device is utilized with the clamp 37 and film positive 25 for aligning the openings 46, 35, respectively therein during exposure. A simple but effective device for this purpose is illustrated in FIG. 7, known as a "registration plate" 47. The registration plate 47 has a plurality of pins 48 upstanding therefrom. The pins 48 have the same size and spacing as the openings 35, 46 (i.e. the external diameter of the pins 48 is essentially the same as, or slightly less than, the diameter of the openings 35, 46, with a spacing between the centers of the pins 48 being identical to the spacing between the openings 35, 46).

FIG. 8 illustrates the manner in which the registration plate 47, clamp 37, and a film positive 25 are positioned, for each screen of the set of screens that are utilized for printing the indicia. The components are assembled so that the film positive 25 receives the pins 48 in the openings 35 thereof, the positive 25 is in contact with the screen fabric 39, and the clamp extension 43 receives the pins 48 in the openings 46 thereof. With the components in the position illustrated in FIG. 8, the components are placed in a conventional exposure unit, and after exposure the components of FIG. 8 are disassembled and the screen fabric 39 is washed. The screen fabric 39 will then have the indicia thereon that is desirably printed on the garments, such exemplary indicia being illustrated schematically at 50 in FIG. 5.

Figure 11:
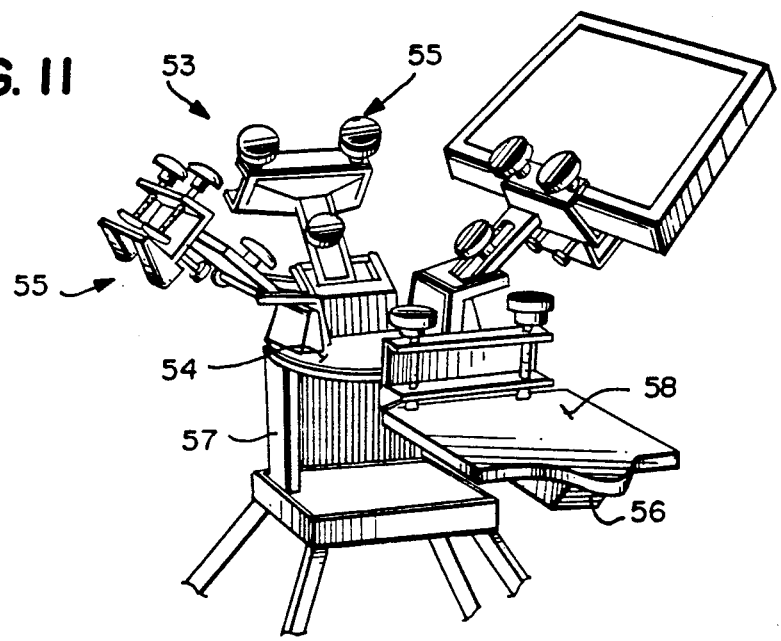
FIG. 11 is a partial perspective view of an exemplary conventional screen printing machine.

Once all of the screens have been exposed, it is then necessary to align the screens with the printing machine. For this purpose a collar is provided, according to the invention. One exemplary form that the collar could take is illustrated generally by reference numeral 52 in FIGS. 9 and 10. The collar 52 is one that is designed to be used directly on the arm of a conventional screen printing machine. Such a conventional machine is illustrated schematically and generally at 53 in FIG. 11, and includes a rotatable head 54 containing a plurality of screen holding structures 55 (one for each color that the machine is capable of printing), with a machine arm 56 extending outwardly from at least one portion of a base 57 below the head 54. The printing platen, such as the T-shirt platen 58 illustrated in FIG. 11, is mounted on the arm 56.

The collar 52 is a rectangular tubular element having sides 59, a bottom 60, and conventional clamping screws 61 extending through each of the walls 59, 60, which may be threaded down so that they tightly engage the arm 56, the arm 56 being illustrated in dotted line in FIG. 10. On the top surface 63 of the collar 52 a plurality of pins 62 are provided. The pins 62 are identical in size and spacing to the pins 48. As a matter of fact, if desirable the collar 52 may be formed so that it has at the top 63 thereof a structure adapted to receive the registration plate 47 in a predetermined position, and after use of the registration plate 47 for exposing the screens, the registration plate 47 may be affixed to the collar 52 with the projections 48 thereof taking the place of the projections 62 illustrated in the embodiment of FIGS. 9 and 10.

Figure 12:
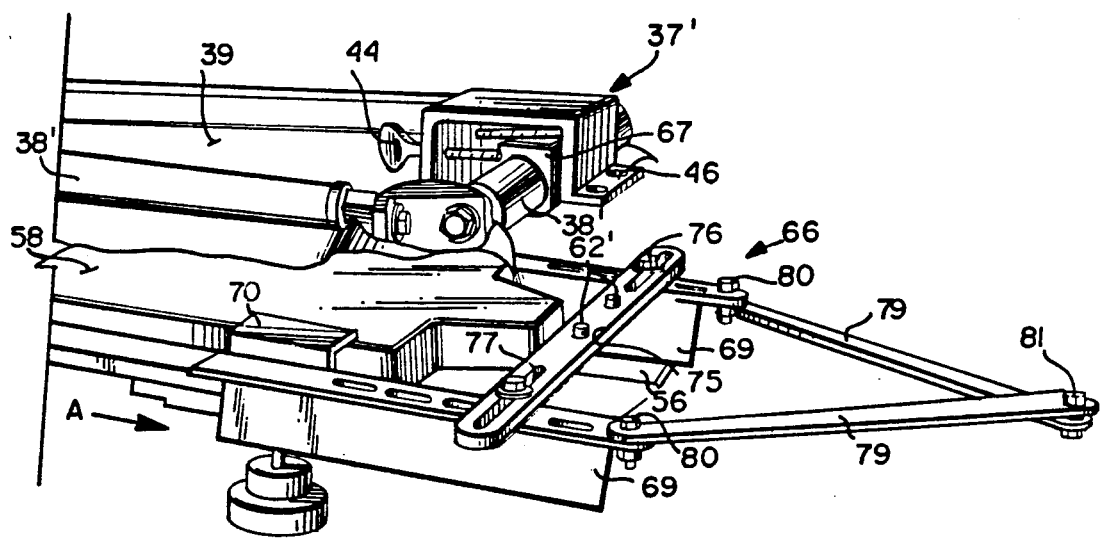
FIG. 12 is a perspective view of an exemplary collar for association with a T-shirt platen, according to the invention, during the alignment of a screen (with associated clamp) with the platen during the practice of the method of the invention.

The collar as utilized according to the invention can take a number of different forms. One particular form that it can take that is particularly desirable is illustrated in FIGS. 12 and 13, wherein the collar 66 attaches directly onto the T-shirt platen 58. In FIG. 12, the collar 66 is illustrated not only in association with the arm 56 in platen 58, but also in association with a screen to be aligned. The screen to be aligned is a conventional aluminum screen having four aluminum side portions 38'. The modified clamp 37' is utilized in this embodiment, the clamp 37' differing from the clamp 37 primarily only in the utilization of an inner component 67 having a U-shaped channel facing inwardly thereof, which receives the generally circular configuration of the aluminum side 38'.

The collar 66 includes side components 69. The side components 69 are preferably aluminum angles. Welded to each of the side components 69 at one end thereof is an aluminum extrusion having a generally C configuration, indicated by reference numeral 70 in FIGS. 12 and 13. The extrusions 70 are welded, or otherwise attached, to the side components 69. The top surface 71 of each extrusion engages the top of the platen 58, while through the bottom portion 72 of each extrusion the conventional screw clamp 73 extends, in screw-threaded relationship therewith, to engage the bottom of the platen 58.

Extending across the side members 69 is the cross member 75. The cross member 75 has pins 62' extending upwardly therefrom, which are adapted to cooperate with the openings 46 in the clamp 37'. The collar 66 must be able to adjust to a wide variety of widths of platens in order to make it versatile, therefore the cross member 75 is connected to the side component 69 by bolts 76, which are received in slots 77 in the cross member 75. Preferably gauges are provided along the length of the slots 77 so that the pins 62' will be located approximately equidistant between the side components 69 when the collar 66 is assembled.

In order to stabilize the collar 66 once the bolts 76 have been tightened, a stabilizing structure is necessary. The preferred stabilizing structure is illustrated in FIG. 12, and includes the two arms 79, which are attached at the first ends thereof by bolts 80 to the side components 69, and are attached at the opposite ends thereof together by a bolt 81. The arms 79 provide an exceptionally simple and exceptionally sturdy stabilizing means.

As seen in FIG. 12, in the alignment of a screen 38' on the printing machine, the screen first is loosely attached to the screen holding structure 55 associated with the machine 53. Then the screen 38' is moved down into the position right above the cross member 75, and then the position of the screen 38' with respect to the machine 53 is adjusted until the openings 46 are aligned with, and receive, the projections 62'. Then the structure 55 is tightened into place to hold the screen positively in the position to which it has been moved. In this position, the screen is accurately registered with the platen 58.

After alignment of each of the screens mounted to the head 54 of the machine 53, the collar 66 is removed from the platen and the clamps 37' removed from the screens. Before the clamps 37' are removed from the screens, however, so that the screens may be utilized again after an interruption in their use, the position of each of the clamps 37' with respect to the screen is marked. This may be done merely by drawing a pencil line on both sides of the clamp 37' on the screen side 38'. In the case of a wooden screen, this may be done by fastening a glazer's wedge into the screen frame on either side of the clamp.

Figure 14:
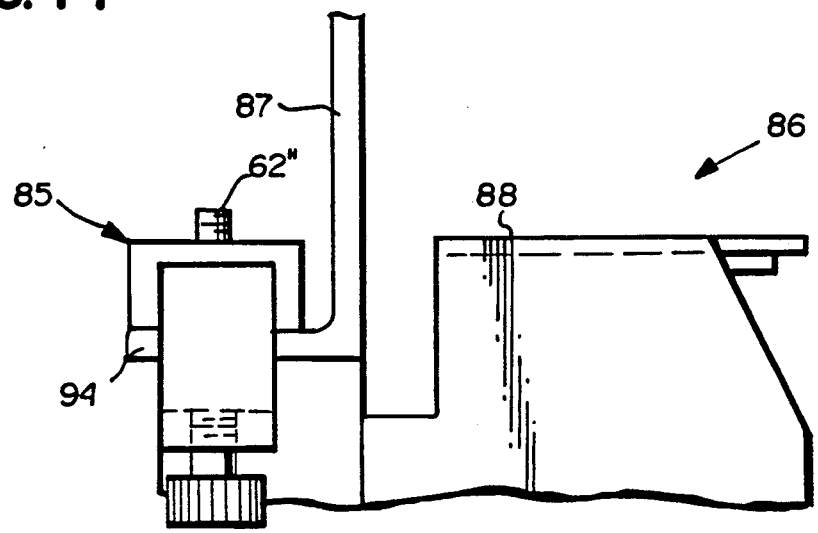
FIG. 14 is a side plan view of a cap printer collar according to the invention shown mounted on a conventional cap printer.
Figure 15:
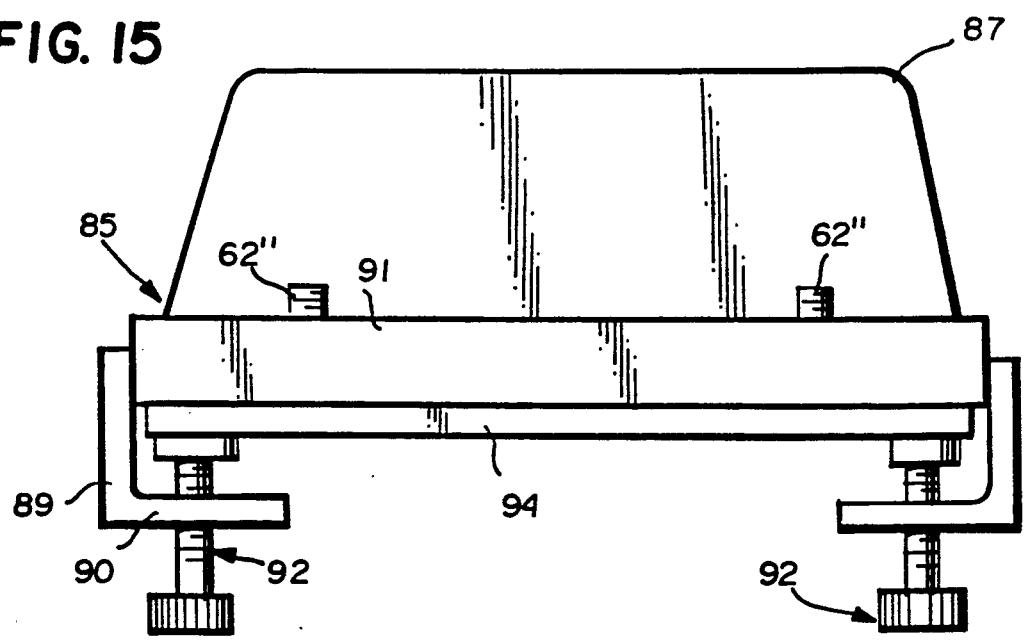
FIG. 15 is an end view of the collar, cap printer combination, of FIG. 14, with the bottom portions of the cap printer not illustrated.

Another form that the collar according to the invention may take is illustrated in FIGS. 14 and 15. The collar in these FIGURES, shown generally by reference numeral 85 is for use with a conventional cap printer 86, preferably of the type shown in co-pending application Ser. No. 548,343 filed Nov. 3, 1983, now U.S. Pat. No. 4,612,856 and in U.S. Pat. No. 4,438,693. This is the type having a bill support 87 adjacent the platen 88.

The collar 85 comprises a pair of side members having a generally C-shape defined by an angle member having side 89 and bottom 90, and a top defined by a portion of the cross member 91. A conventional clamping screw 92 extends through the portion 90 in screw-threaded engagement with an opening therein. The cross member 91 has the projections 62" extending upwardly therefrom. Those pins 62", of course, cooperate with the openings 46 in an appropriate clamp.

The collar 85 is positioned, during use, as illustrated in FIGS. 14 and 15., being slid onto the horizontally extending portion 94 of the bill support 87, with the cross member 91 engaging the top of the portion 94, and with the screws 92 tightened into place against the bottom of the member 94, as seen most clearly in FIG. 15.

Figure 16:
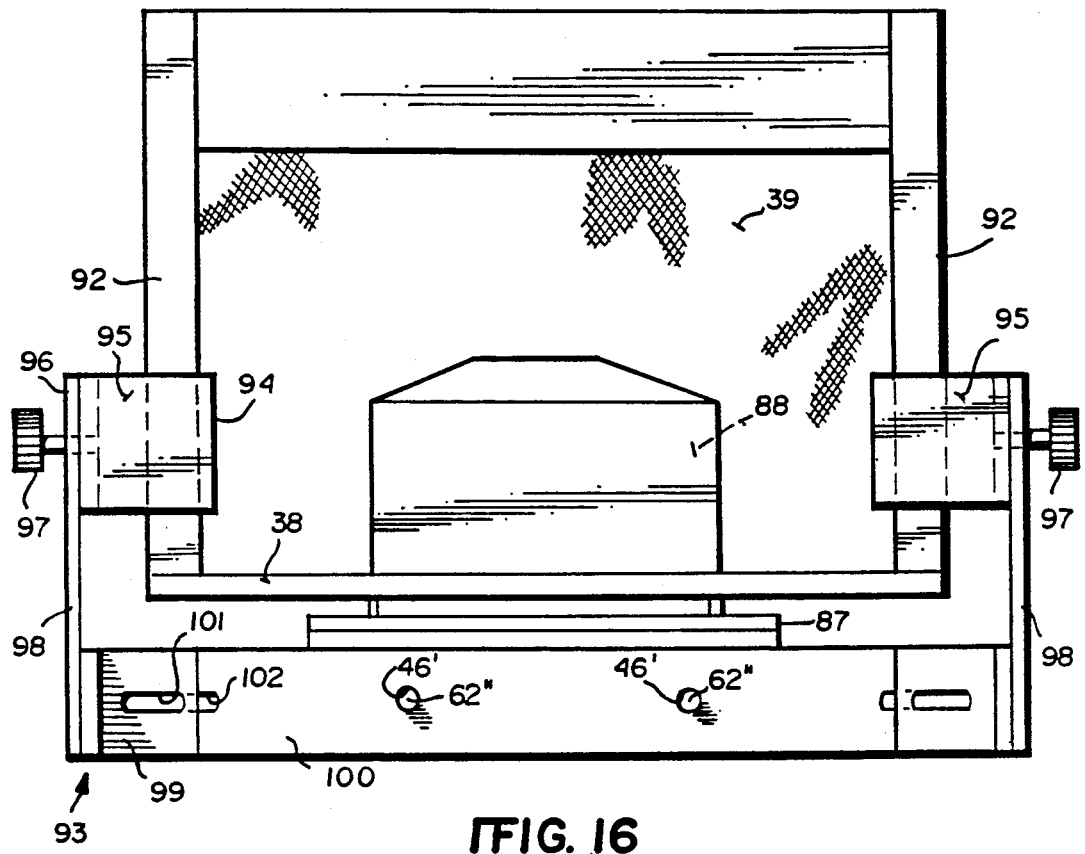
FIG. 16 is a top view of the cap printer collar of FIGS. 14 and 15 shown in association with a screen and clamp specifically designed for use therewith.
Figure 17:
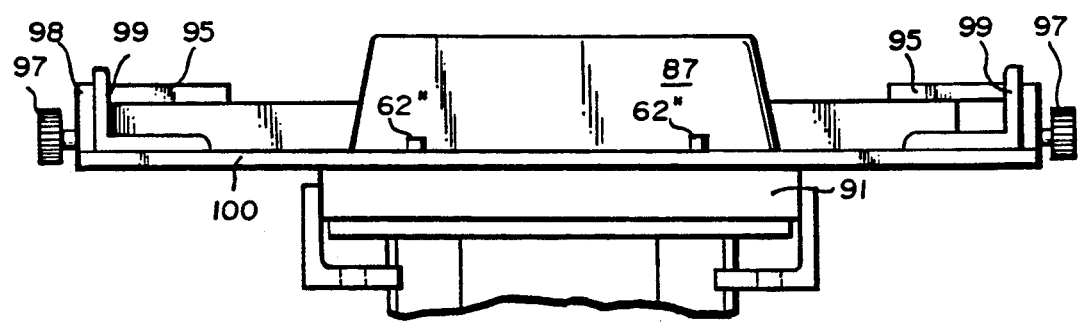
FIG. 17 is an end view of the structure of FIG. 16.

While for a cap printer without a bill support 87, a clamp such as the clamps 37, 37' may be utilized, when the bill support 87 is provided it is desirable to use the clamp illustrated in FIGS. 16 and 17.

FIG. 16 shows a screen having one frame portion 38, and side frame portions 92. Mounted in operative association with the portions 92 is the cap printer clamp 93. The clamp 93 includes a pair of identical side clamping components which engage the frame portions 92. These side clamping components define an inverted C channel, having one portion 94 engaging the interior of the frame portion 92, another portion 95 at the top, and another side portion 96. In operative association with the side portion 96 is a conventional clamping screw 97 which is tightened down to hold the clamp portion in operative association with frame section 92. A portion 96 is part of an arm 98 which has at the end thereof, opposite the portion 96, an angle element 99. The angle 99 is welded to the arm 98, and is connected to the cross member 100. Attachment of angle 99 to the cross member 100 is preferably effected by removable nuts and bolts (not shown) which cooperate with the elongated slots 101, 102 formed in the angle 99 and the cross member 100, respectively (see FIG. 16). The elongated slots 101, 102 allow adjustment of the width between the arms 98, to accommodate screens and cap printers of different sizes.

Formed in the cross member 100 are a pair of openings 46' identical in dimension and spacing to the openings 46 and the clamps 37, 37'. As illustrated in FIGS. 16 and 17, the openings 46' receive the pins 62" therein for positively locating the clamp 93, and connected screen, in place during registration of the screen on the printing machine.

The structures according to the present invention may readily be packaged together in kit form, and because of their versatility may be used on a wide variety of different types of printing machines, platens, and the like. Preferably all of the components are made out of a lightweight metal, such as aluminum, although they can also be formed of suitable plastic or like materials.

It will thus be seen that according to the present invention a simple yet effective method and apparatus have been provided for greatly facilitating the accurate registration of screens with a platen, particularly for the printing of garments such as caps and T-shirts. While the invention has been herein shown and described in what is presently conceived to be the most practical and preferred embodiment thereof, it will be apparent to those of ordinary skill in the art that many modifications may be made thereof within the scope of the present invention. For instance, instead of providing pins on the registration plate and collar and openings in the clamp, pins may be provided on the clamp and openings in the registration plate and collar. Other modifications also are possible within the scope of the invention, which scope is to be accorded the broadest interpretation of the appended claims so as to encompass all such equivalent structures and methods.

What is claimed is:

1. A kit for facilitating the accurate registration of each of a plurality of printing screens in association with a printing platen for the screen printing of garments, comprising:

a registration plate having a plurality of pins upstanding therefrom, the pins having a predetermined size and predetermined spacing from each other;

a plurality of clamps, each clamp having a clamping portion dimensioned to engage the frame of a screen for the screen printing of garments, and having a portion with a plurality of openings therein, the openings having the same size and spacing as the pins of the registration plate; and a collar for operative, removable attachment to a garment screen printing machine, the collar having printing machine-engaging components, and a plurality of upstanding pins, the upstanding pins having the same size and spacing as the openings in the clamp portion.

2. A kit as recited in claim 1 wherein the collar comprises a collar adapted to be mounted to a T-shirt platen, the collar having a pair of side components each having a clamp associated therewith, the clamps adapted to engage the sides of a T-shirt platen; an adjustable cross member adjustably mounted to said side components spaced from said clamps, said cross member having said upstanding pins extending therefrom; and stabilizing means connected to said side components, said stabilizing means stabilizing the side components and cross member in any position to which said cross member has been disposed with respect to said side components.

3. A kit as recited in claim 2 wherein said stabilizing means comprises a pair of arms each having first and second ends, said arms bolted to said side components, on the opposite side of said cross member from said clamps, at the first ends thereof, and bolted to each other at the second ends thereof.

4. A kit as recited in claim 1 wherein said collar comprises a collar for a cap printer, said collar including a pair of C-shaped side portions, each side portion having a bottom component through which a clamping screw extends; and a cross component interconnecting the side portions, said upstanding pins extending from said cross component.

5. A kit as recited in claim 1 wherein said collar is adapted to be mounted directly on an arm of a screen printing machine, said collar comprising a rectangular cross-section with a clamping screw operatively disposed in association with the two sidewalls and bottom wall thereof, with said pins upstanding from said top wall.

6. A kit as recited in claim 1 wherein said clamp comprises a clamp for a wooden screen, having substantially parallel first and second side portions defining an open channel a clamping screw extending through said second side portion, and a bottom portion interconnecting said side portions and substantially perpendicular thereto; and wherein said clamping screw extends substantially perpendicularly from said first side portion at the opposite end thereof from said bottom portion.

7. A kit as recited in claim 1 wherein said clamp comprises a clamp for an aluminum screen frame, said clamp having substantially parallel first and second sides defining an open top, with a bottom portion connecting, and substantially perpendicular to, said sides; a clamping screw extending through said second side; a screen-frame engaging portion having a generally U-shaped channel connected to said first side and extending therefrom towards said second side; and said channel extending outwardly from said first side at the end thereof opposite said bottom.

* * * * *